Nov. 17, 1964 J. H. FLAHERTY 3,157,828

ENCAPSULATED PRINTED CIRCUIT MODULE WITH HEAT TRANSFER MEANS

Filed Aug. 11, 1960

INVENTOR.
James H. Flaherty
BY Paul J. Ethington
ATTORNEY

United States Patent Office 3,157,828
Patented Nov. 17, 1964

3,157,828
ENCAPSULATED PRINTED CIRCUIT MODULE WITH HEAT TRANSFER MEANS

James H. Flaherty, Shorewood, Wis., assignor to General Motors Corporation, Detroit, Mich., a corporation of Delaware Filed Aug. 11, 1960, Ser. No. 49,028
1 Claim. (Cl. 317—100)

This invention relates to electronic packaging and more particularly to encapsulated printed circuit modules having weldable circuit connections.

In the production of very complex equipment such as missiles, reliability is of the utmost importance. The reliability of electronic equipment is reduced by mechanical vibration, stresses arising from thermal variance, excess heat built up within the electronic package, and the very frequent failure of solder joints.

The object of this invention is to provide a module which is very compact and yet is relatively free from thermal stresses, is protected against vibration, prevents undesirably high internal temperatures, and eliminates failure of the electrical connections. Another object is to provide a module configuration which will permit high temperature welding of the electrical connections without causing damage to heat sensitive components.

These objects are accomplished by this invention which provides a module having electrical components sandwiched between printed circuit boards with the electrical connections being made externally of the sandwich. In addition, heat transfer means partially within the module serves to conduct away excess heat.

The above and other advantages will be apparent from the following specification and the accompanying drawings in which like numerals refer to like parts and in which.

Figure 1:
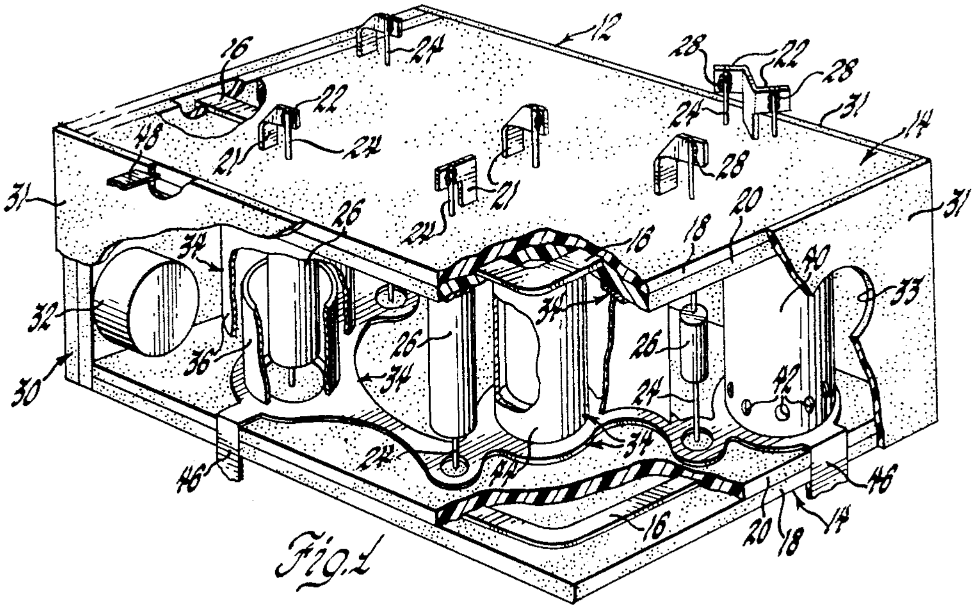
FIGURE 1 is a perspective view partly broken away of an electronic module embodying the subject invention.

Referring to FIGURE 1, an electronic module 12 includes a pair of spaced parallel printed circuit boards 14, each of which is made of flat circuit conductors 16 sandwiched between two dielectric panels 18 and 20. The dielectric is an epoxy, a phenolic resin or any other conventional circuit board material. Use of a material which has the same coefficient of expansion as the potting material 38, to be described, prevents unnecessary stresses due to unequal rates of expansion. In practice, the conductors 16 may be stamped out of sheet metal to form the desired circuit configuration and sealed between the panels 18 and 20 by a pressing operation. An alternative construction for the board is to merely mold suitable plastic material around the preformed circuitry 16. The end portions 21 of the conductors, however, are bent toward the outside of the module so that they extend through the outer panel 18 and perpendicular thereto. The extreme ends of the conductors 16 are formed or twisted into tabs 22 which extend parallel to and in a plane perpendicular to the circuit boards 14. This facilitates adjustment of each tab 22 to a position adjacent other electrical leads 24.

A group of resistors, capacitors, transistors and other electrical components 26 are situated between the spaced printed circuit boards 14 and substantially perpendicular thereto. The leads 24 from the components 26 extend through preformed apertures in each board 14 and are located adjacent the outwardly turned tabs 22 of the printed circuit and are connected thereto by welds 28.

One or more auxiliary circuit boards 30 may be placed between the edges of and perpendicular to the two main circuit boards 14. This can serve as a means for electrically connecting the circuitry of the two main boards 14 and for providing additional space for mounting other components 32, as well as adding structural support to the assembly. Where the auxiliary boards 30 are not utilized, it is preferable to place metal or plastic walls 31 around the module. An opening 33 is provided in one of the walls 31 to permit the introduction of potting material.

Heat transfer surfaces 34 made of any convenient heat conducting material such as aluminum are disposed along the inner surfaces of the circuit boards 14 and in addition are formed to surround those components 26 which tend to generate substantial amounts of heat or which particularly need to be protected from the heat given off by neighboring components. As illustrated in FIGURE 1, one type of heat transfer surface 34 is made of two radially spaced concentric cylinders 36 having overlapping inner ends and each having its outer end secured to one of the flat transfer surfaces 34 adjacent the circuit boards 14. This construction not only serves to conduct heat away from the enclosed component but also permits potting material 38 to be introduced to the interior of the cylinders so as to fully surround the component. Further it will eliminate any possible thermal stresses arising from the expansion of the transfer surface in the axial direction. Another type of cylindrical heat transfer surface 40 has a series of openings 42 spaced around its periphery so as to permit admission of potting material 38. In the event that it should be undesirable to surround a particular component with potting material the heat transfer surface may be made impervious to provide a complete enclosure 44. It is obvious that these transfer surfaces 34 may also serve as electromagnetic shields.

Figures 2, 3:
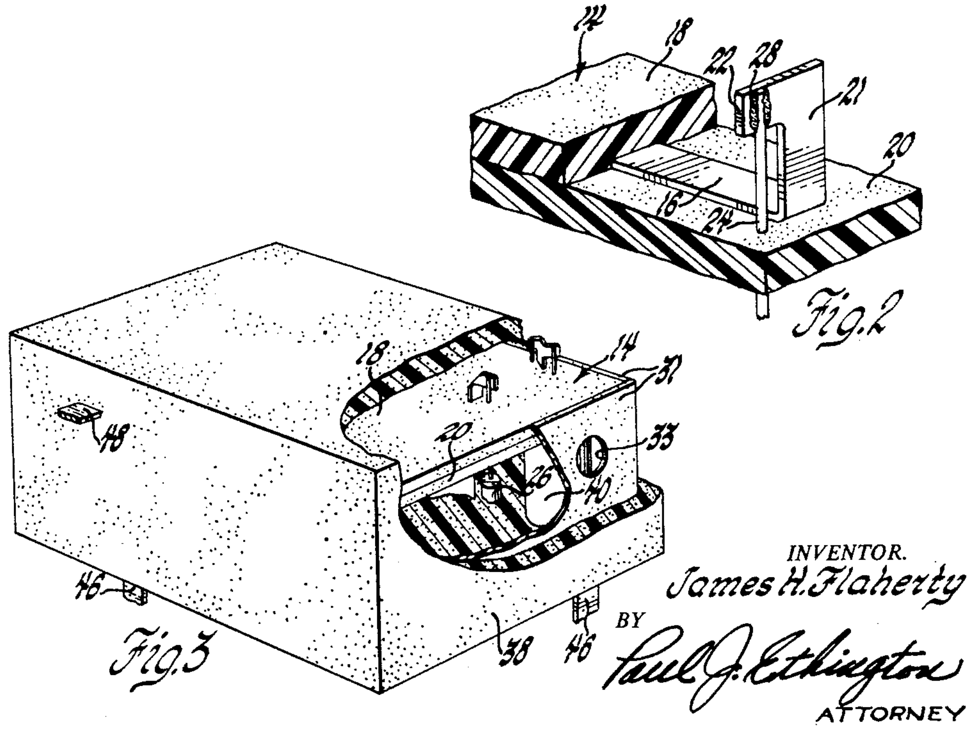
FIGURE 2 is an enlarged fragmentary view of a welded electrical connection of FIGURE 1.
FIGURE 3 is a perspective view partly broken away of an encapsulated module embodying the subject invention.

As illustrated in FIGURE 3, the entire space between the circuit boards as well as the space surrounding the welded connections is filled with encapsulating or potting material 38. Polyurethane foam is preferred as the potting material since it has a satisfactory heat transfer factor and is easily injected into the assembly. The polyurethane, in cooperation with the heat transfer surfaces is very effective in conducting heat from the module. To dissipate the heat, heat conducting leads 46 extend from the heat transfer surfaces 34 outwardly through the encapsulated material 38 to a heat sink, not shown. Similarly, portions 48 of the electrical circuit protrude through the encapsulated material 38 to provide exterior connections.

It will thus be seen that this invention provides an extremely reliable and compact electronic package. The electrical connections are all made exteriorly of the panel boards so that high temperature welding techniques may be used to make the connections, and yet the circuit board 14 itself, as well as the heat transfer surfaces 34, will protect the electronic components 26 from the welding heat. Of course, other types of connecting methods such as soldering and electroplating may be used but these are known to be inferior to the welding processes as far as reliability is concerned.

A very strong module results from the potted construction, and it is even further strengthened by the auxiliary boads 30 or walls 31 as well as by those heat transfer surfaces 40, 44 which extend from one panel board to the other. Of course, the potting material 38 serves to prevent leakage between the various components and tends to protect the assembly from mechanical vibration.

Although a preferred embodiment of the invention has been described and illustrated, it is to be understood that modifications may be made in the structural details thereof without departing from the broader spirit and scope of the invention, as defined in the appended claim.

I claim:

A printed circuit package comprising a pair of spaced parallel printed circuit boards, each of said boards having an inner and outer panel of dielectric material, circuit conductors disposed between said panels and connection tabs extending from said conductors through said outer panel, a plurality of electrical components extending between said circuit boards and having terminal wires extending through said boards and welded to said tabs, heat transfer surfaces surrounding at least some of said components and being connected for heat transfer therefrom by additional heat transfer surfaces in engagement with said inner panels of the circuit boards, said additional surfaces having a portion thereof extending through one of said panels and adapted to be connected to a heat sink external to said package whereby excess heat is removed from said package and the components are maintained at thermally stable operating points, and a foamed dielectric material encapsulating the entire assembly.

References Cited in the file of this patent

UNITED STATES PATENTS

| | | |
|---|---|---|
| 2,433,384 | McLarn | Dec. 30, 1947 |
| 2,857,558 | Fiske | Oct. 21, 1958 |
| 2,862,992 | Franz | Dec. 2, 1958 |
| 2,871,548 | Pisani | Feb. 3, 1959 |
| 2,876,391 | Sanders | Mar. 3, 1959 |
| 2,907,926 | Slack | Oct. 6, 1959 |
| 2,932,772 | Bowman | Apr. 12, 1960 |
| 2,958,064 | Swengle | Oct. 25, 1960 |
| 2,960,633 | Hall | Nov. 15, 1960 |
| 3,098,951 | Ayer et al. | July 23, 1963 |

FOREIGN PATENTS

| | | |
|---|---|---|
| 646,314 | Great Britain | Nov. 22, 1950 |
| 753,445 | Great Britain | July 25, 1956 |
| 220,042 | Australia | June 20, 1957 |

OTHER REFERENCES

Davidson: "Designing Potted Circuits," published in Electronic Design, March 1955 (pages 38 and 39 relied on).